United States Patent [19]

Norimatsu

[11] Patent Number: 5,465,400
[45] Date of Patent: Nov. 7, 1995

[54] POWER SUPPLY CONTROL DEVICE FOR CONTROLLING THE TURNING ON AND OFF OF POWER SUPPLY

[75] Inventor: Hidehiko Norimatsu, Tokyo, Japan

[73] Assignee: NEC Corporation, Tokyo, Japan

[21] Appl. No.: 958,792

[22] Filed: Oct. 9, 1992

[30] Foreign Application Priority Data

Oct. 9, 1991 [JP] Japan .................................. 3-290563

[51] Int. Cl.[6] .................................................. H04B 1/40
[52] U.S. Cl. ........................... 455/76; 455/127; 455/343; 307/125
[58] Field of Search ............................. 455/89, 127, 317, 455/318, 319, 343, 76; 331/14, 16; 307/125, 126, 130, 140

[56] References Cited

U.S. PATENT DOCUMENTS

| | | | |
|---|---|---|---|
| 3,566,143 | 2/1971 | Paine | 307/33 |
| 4,317,056 | 2/1982 | Alberts | 307/350 |
| 4,342,922 | 8/1982 | DiMassimo et al. | 307/66 |
| 4,673,892 | 6/1987 | Miyashita | 331/14 |
| 4,864,155 | 9/1989 | Scmitz | 307/125 X |
| 5,270,576 | 12/1993 | Kahle | 307/125 |
| 5,317,309 | 5/1994 | Vercellotti et al. | 455/343 |
| 5,402,446 | 3/1995 | Minami | 455/343 |

FOREIGN PATENT DOCUMENTS 154524  6/1990  Japan .

*Primary Examiner*—Edward F. Urban
*Attorney, Agent, or Firm*—Sughrue, Mion, Zinn, Macpeak & Seas

[57] ABSTRACT

Disclosed here is a power supply control circuit responsive to a control signal for intermittently supplying a battery voltage to a frequency synthesizer so as to restrain the exhaustion of the built-in battery. In order that the charge of the capacitor of an active LPF, inserted between the built-in battery and the frequency synthesizer to constitute this power supply control circuit, may not be released toward the synthesizer side during the suspended period of voltage supply to the synthesizer, switching means responsive to said control signal is added. This power supply control circuit can advance the rise of the supply voltage, and accordingly the stabilization of the output frequency of the synthesizer, when said voltage supply is resumed.

9 Claims, 3 Drawing Sheets

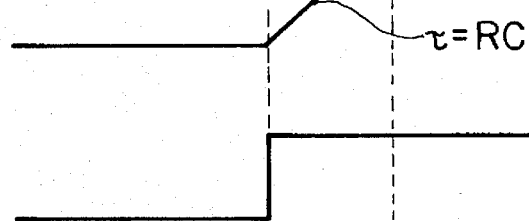
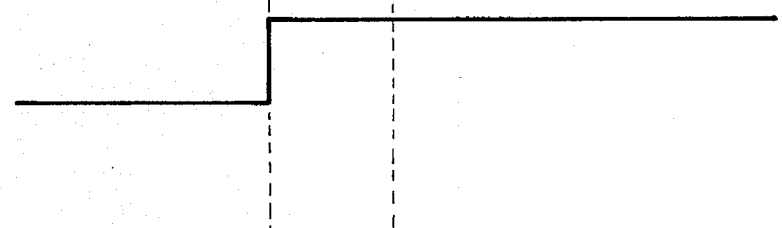
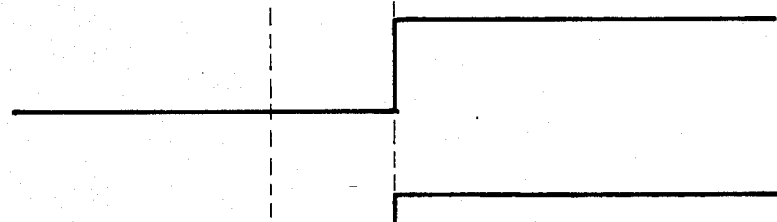
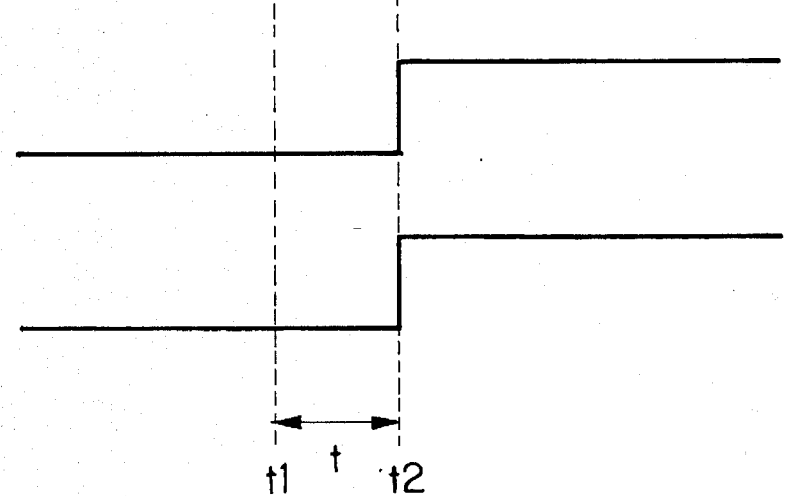

5,465,400

POWER SUPPLY CONTROL DEVICE FOR CONTROLLING THE TURNING ON AND OFF OF POWER SUPPLY

BACKGROUND OF THE INVENTION (1) Field of the Invention

The present invention relates to a power supply control circuit for controlling the turning on and off of power supply for use in a battery-powered portable radio communication apparatus, such as a portable radio frequency signal transmitter/receiver apparatus, to save their power consumption, and to a frequency synthesizer coupled to that control circuit and built into said communication apparatus.

(2) Description of the Prior Art

A portable radio communication apparatus of this kind is provided with a battery power saving function, which turns off the power supply circuit when no power is needed so that the battery can be protected from exhaustion as much as possible and maximized in useful life. At the same time, an apparatus of this kind is equipped with a frequency synthesizer as the source of local oscillation signals and, as the basic constituent element of the synthesizer, with a voltage-controlled oscillator (VCO). In order to stabilize this VCO, i.e., to remove noise and ripples from the power source, an active low-pass filter (ALPF) is inserted into the power supply circuit for the VCO. This ALPF consists of a resistor and a capacitor connected in series, and a transistor to supply the VCO with a voltage corresponding to the terminal voltage of the capacitor.

Meanwhile, the control unit for said communication apparatus performs constant monitoring to check whether the VCO of the frequency synthesizer needs to be on, allows the power supply from the battery to the ALPF only as long as it is actually required, and thereby keeps the battery from wasteful exhaustion. However, when the power supply is suspended, the charge of the ALPF's capacitor is released through said transistor to the VCO to reduce the terminal voltage of said capacitor to virtual zero. As a result, the resumption of the source voltage from the battery to the ALPF to turn on the frequency synthesizer, i.e. its VCO, would bring about no steep rise of the terminal voltage of the capacitor. Thus the charge of the capacitor rises from zero with a time constant determined by the resistance of the resistor and the capacitance of the capacitor. Since a considerably low cutoff frequency is selected for this ALPF with a view to removing said noise and the like, it has a fairly large time constant, and accordingly it takes a long time to bring the output of said transistor into a steady state by charging said capacitor. Therefore, other circuits which receive the supply of local oscillation signals from the synthesizer are also delayed in actuation, and said portable radio apparatus can neither transmit nor receive signals during the period of delay.

If the start of the charging of the ALPF's capacitor is advanced by a length of time corresponding to said time constant in order to avoid this delay, the power saving effect will be correspondingly reduced. There also is a technique to insert a diode in parallel with said resistor in order to shorten the charging time of said capacitor (for details, see Laid-open Patent Application No. 2-154524, published on Jun. 13, 1990), but the configuration described in the gazette would let the capacity content and the rectifying action of the diode deteriorate the noise and ripple removing effect of the ALPF adversely.

BRIEF SUMMARY OF THE INVENTION

OBJECT OF THE INVENTION

Therefore an object of the present invention is to provide a power supply control circuit which can control in a short response time the turning on and off of the power supply circuit to reduce the power consumption of a battery-powered portable radio communication apparatus without adversely affecting the performance to remove noise and ripples from the power source, and a frequency synthesizer having this control circuit built into it.

SUMMARY OF THE INVENTION

According to the invention, there is provided a power supply control circuit inserted between a built-in battery of a portable radio frequency signal transmitter/receiver apparatus and a built-in frequency synthesizer receiving voltage supply from the battery and generating high frequency signals for various circuits within said transmitter/receiver apparatus, and responsive to a control circuit for turning on and off said voltage supply intermittently so as to restrain the exhaustion of said battery, said power supply control circuit comprising: an active low-pass filter (ALPF) including a serially connected circuit consisting of a resistor connected to one of the electrodes of said battery and a capacitor one of whose terminals is connected to a reference potential point, and a first transistor inserted between one of the electrodes of said battery and the power input terminal of said frequency synthesizer and having a control electrode; and a switching circuit having a second transistor responsive to said control signal for selectively connecting the connecting point between the two elements of said serially connected circuit and the control electrode of said first transistor, wherein the charge of said capacitor is in a substantially steady state at the time said selective connection is accomplished in response to said control signal and accordingly said voltage supply is in a steady state from that time on.

BRIEF DESCRIPTION OF THE DRAWINGS

The above-mentioned and other objects, features and advantages of the present invention will become more apparent from the following detailed description when taken in conjunction with the accompanying drawings, wherein:

FIGS. 3(a) to 3(e) illustrate a voltage waveform diagram for explaining the operation of this preferred embodiment.

DETAILED DESCRIPTION OF THE PREFERRED EMBODIMENT

Figure 1:
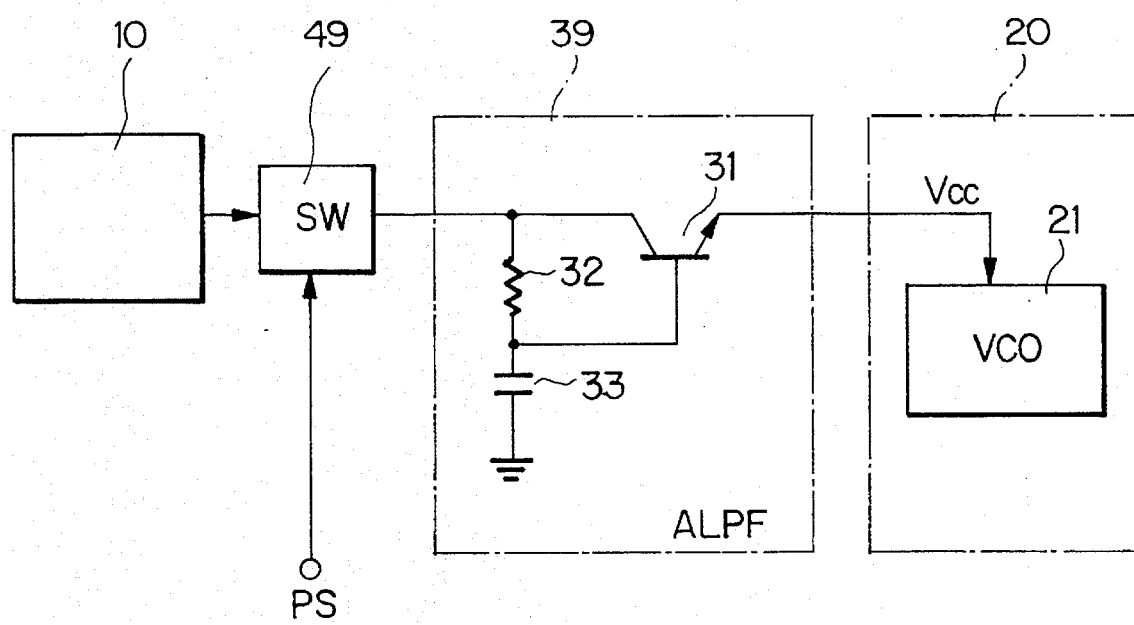
FIG. 1 is a block diagram of a power supply control circuit according to the prior art, partly including circuit diagrams.

In the embodiment of the prior art illustrated in FIG. 1, a source voltage from a battery 10 is supplied to an active low-pass filter (ALPF) 39 through a switch (SW) 49 which is turned on and off in response to a power saving control signal PS from a transmission/reception control unit (not shown) and, cleared of noise and ripples, further supplied to a voltage-controlled oscillator circuit (VCO) 21 of a frequency synthesizer 20. These constituent elements, i.e. the elements from the battery 10 to the frequency synthesizer 20 including said transmission/reception control unit, are accommodated in a single housing to constitute a portable radio frequency signal transmitter/receiver apparatus.

The ALPF 39 has an NPN transistor 31 whose collector and emitter are respectively connected to said switch 49 and said VCO 21, and a serial resistor 32/capacitor 33 circuit connected in series between the collector of the transistor 31 and a reference potential point (usually the ground potential point). The connecting point between the resistor 32 and the capacitor 33 in this serial circuit is connected to the base of the transistor 31, and a voltage Vcc, which varies according to the time constant of this serial circuit, is supplied from its emitter to the VCO 21.

During a period when the control signal PS from said transmission/reception control unit rises to a high (H) level and indicates the absence of the need for power supply to the VCO 21, the SW 49 is turned off to suspend the supply of power from the battery 10. Along with the turning off of the SW 49, the charge of the capacitor 33 is released through the transistor 31 and the VCO 21. Then, when the control signal PS falls to a low (L) level to turn on the SW 49 to resume the driving of the VCO 21, the source voltage is again fed to the ALPF 39 from the battery 10.

At the time the battery voltage again begins to be fed to the ALPF 39, the capacitor 33 has no electric charge because of the aforementioned discharging, and accordingly the charging by this resumption of voltage supply begins from zero volt. Thus the supply voltage Vcc from the ALPF 39 to the VCO 21 rises according to a time constant $\tau$ determined by the product RC of the resistance R of the resistor 32 and the capacitance C of the capacitor 33 (FIG. 3(b)). Therefore, the starting of the VCO 21 does not take place at the point of time t1, when the control signal PS is fed, but is delayed by a length of time t until the point of time t2, when said supply voltage Vcc attains a steady state (FIG. 3(c)). In order to let the VCO 21 start in synchronism with the control signal PS at the point of time t1, the actuation of the switch 49 should be advanced by the length of time t to start the voltage supply from the battery 10 earlier. Thus the power saving effect is reduced correspondingly to the advanced start of the voltage supply. Moreover, in order to ensure the effect of the ALPF 39 to remove noise and ripples from the power source, the cutoff frequency of this ALPF should be set relatively low, inevitably inviting an increase in said capacitance C, with the result that the length of time t is extended and said reduction of the power saving effect is made considerably great (FIG. 3(c)).

Figure 2:
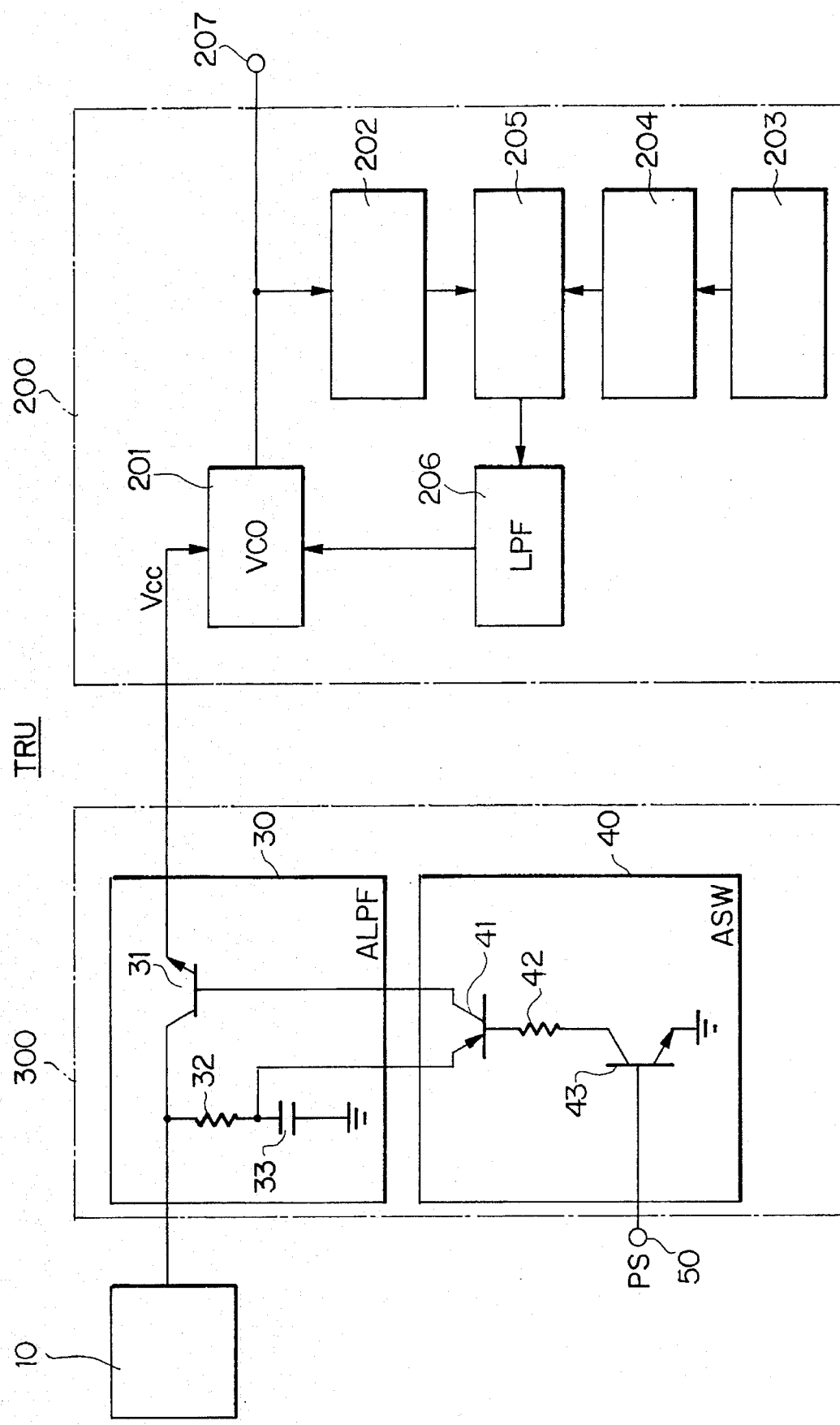
FIG. 2 is a block diagram of a preferred embodiment of the present invention, illustrated in the same manner as FIG. 1.

Referring next to FIG. 2 in which the same constituent elements as in FIG. 1 are assigned respectively the same reference numerals, a radio frequency signal transmitter/receiver apparatus TRU, to which the present invention is applied, includes a power supply control circuit 300, a frequency synthesizer 200 and a housing (not shown) to accommodate them.

The power control circuit 300 is provided with an ALPF 30 including constituent elements 31, 32 and 33 which are in common with the ALPF 39 in the prior art apparatus of FIG. 1, and an ALPF drive switch (ASW) 40, which is inserted between the connecting point between the two elements of the serial resistor 32/capacitor 33 circuit of this ALPF 30 and the base of the NPN transistor 31, for turning on and off the connection between them in response to a control signal from a control signal input terminal 50.

The ASW 40 is provided with an NPN transistor 43 whose base and emitter are respectively connected to the control signal input terminal 50 and a reference potential (usually the ground potential), and a PNP transistor 41 of which the base is connected to the collector of this transistor 43 through a resistor 42, the emitter is connected to the connecting point between the two elements of said serial resistor 32/capacitor 33 circuit, and the collector is connected to the base of the transistor 31.

At the time of voltage supply to the frequency synthesizer 200, when the control signal PS from the control unit (not shown) of the portable radio transmitter/receiver apparatus TRU rises to an H level, the transistor 43 of the ASW 40 is turned on to let the base current of the transistor 41 flow, and connection is achieved between the connecting points between the two elements of the serial resistor 32/capacitor 33 circuit and the base of the transistor 31 to turn on the transistor 31. This results in the supply of the output voltage Vcc of the power supply control circuit 300 to the frequency synthesizer 200. On the other hand, as the transistor 41 is turned on, the ALPF 30 is enabled to operate as an LPF having a cutoff angle frequency of 1/RC and remove noise and ripples from the power source. Meanwhile, when the control signal falls to an L level, both transistors 43 and 41 are turned off, and accordingly the transistor 31 is also turned off, resulting in a suspension of the supply of the voltage Vcc to the frequency synthesizer 200. In this state, since the capacitor 33 remains connected to the battery 10 through the resistor 32, the terminal voltage in the charging state is maintained. Therefore, when the control signal rises to the H level next time, the ALPF 30 immediately achieves a steady state, giving no delay to the rise of the voltage Vcc (FIGS. 3 (d) and (e)).

The frequency synthesizer 200 is provided with a VCO 201, which receives the supply of the source voltage Vcc, for generating signals of prescribed frequencies including local oscillation signals and supplying them from an output terminal 207 to various circuits (not shown) within the portable transmitter/receiver apparatus TRU; a frequency divider 202 for frequency-dividing the output of the VCO 201; a reference frequency oscillator 203 for generating a reference frequency signal; a reference frequency divider 204 for frequency-dividing the reference frequency signal; a phase comparator 205 for generating an error signal representing the phase difference between the output of the frequency dividers 202 and 204; and an LPF 206 for subjecting this error signal to time quadrature to supply the resultant signal to the VCO 201 as a frequency control voltage signal, and constitutes a phase-locked loop (PLL) circuit. The circuit configuration of the frequency synthesizer 200 to restrain the exhaustion of the battery 10 by allowing the supply of the voltage Vcc only as long as is specified by the control signal PS from the control unit is not described in detail here, because it is started in the specification of the U.S. Pat. No. 4,673,892.

In the above described preferred embodiment of the present invention, the polarity of the voltage from the battery 10 is not limited to positive, but may as well as negative. In that case, PNP, NPN and PNP transistors are used as said transistors 31, 41 and 43, respectively. The transistor 31 can be replaced with a unipolar transistor, such as a field effect transistor (FET). If a FET is used, the collector shall read the drain, the emitter the source, and the base the gate in the above description. The ASW 40 is not limited to what is described here, but various other versions are conceivable.

As hitherto described, in the voltage control circuit of the battery-powered portable radio communication apparatus according to the present invention, no delay occurs in the rise of the supply voltage at the time of the resumption of its supply in response to the power saving control signal from the control unit and accordingly in the rise of the oscillation of the frequency synthesizer receiving the supply of that voltage, and therefore power consumption can be saved without adversely affecting the performance to remove noise and ripples from the power source.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A power supply control device for a portable radio frequency signal transmitter/receiver including a battery and a frequency synthesizer receiving voltage supply from said battery, said power supply control device being disposed between said battery and said frequency synthesizer and controlling to turn on and off said voltage supply intermittently so as to restrain the exhaustion of said battery, said power supply control circuit comprising:

an active low-pass filter including a serially connected circuit consisting of a resistor, connected to one of the electrodes of said battery, and a capacitor one of whose terminals is connected to a reference potential point, and a first transistor inserted between said one of the electrodes of said battery and a power input terminal of said frequency synthesizer and having a control electrode; and a switching circuit having a second transistor responsive to a control signal for selectively connecting a connecting point between said resistor and said capacitor to the control electrode of said first transistor, wherein:

the charge of said capacitor is in a substantially steady state at the time said selective connection is accomplished in response to said control signal and accordingly said voltage supply is in a steady state from the time said selective connection is accomplished.

2. A power supply control device, as claimed in claim 1, wherein said first transistor is a bipolar transistor of which the collector electrode is connected to one of the electrodes of said battery, the emitter electrode is connected to the power supply input terminal of said frequency synthesizer, and the base electrode is connected through said switching circuit to the connecting point between the two elements of said serially connected circuit.

3. A power supply control device, as claimed in claim 1, wherein said first transistor is a field effect transistor of which the drain electrode is connected to one of the electrodes of said battery, the source electrode is connected to the power supply input terminal of said frequency synthesizer, and the gate electrode is connected through said switching circuit to the connecting point between the two elements of said serially connected circuit.

4. The power supply control device as claimed in claim 1, wherein said battery is directly connected to said active low-pass filter.

5. The power supply control device as claimed in claim 1, wherein said switching circuit comprises:

a third transistor whose base, emitter and connector are respectively connected to an input terminal of said control signal, a reference potential and a base of said second transistor.

6. A control device for turning on and off a voltage supply comprising:

a battery;

an active low-pass filter for removing noise and ripples from a power voltage of said battery, wherein said active low-pass filter comprises a serially connected circuit consisting of a resistor, connected to one of the electrodes of said battery, and a capacitor one of whose terminals is connected to a reference potential point, and a first transistor inserted between said one of the electrodes of said battery and a power input terminal of a circuit supplied said power voltage and having a control electrode; and a switching circuit having a second transistor responsive to a control signal for selectively connecting a connecting point between said resistor and said capacitor to the control electrode of said first transistor.

7. The control device as claimed in claim 6, wherein said battery is directly connected to said active low-pass filter.

8. The control device as claimed in claim 6, wherein said switching circuit comprises a third transistor whose base, emitter and connector are respectively connected to an input terminal of said control signal, a reference potential and a base of said second transistor.

9. A control device for turning on and off a voltage supply to a circuit, comprising:

first means for supplying a battery voltage to a circuit;

filter means for removing noise and ripples from said battery voltage, wherein said filter means comprises a serially connected resistor, one end of which is connected to an electrode of said first means, and a capacitor, one of whose terminals is connected to a reference potential, and a first transistor inserted between said electrode of said first means and a power input terminal of said circuit and having a control electrode; and switching means having a second transistor responsive to a control signal for selectively connecting a connecting point between said resistor and said capacitor to the control electrode of said first transistor, whereby the charge of said capacitor is in a substantially steady state at the time said selective connection is accomplished in response to said control signal and accordingly said voltage supply is in a steady state from the time said selective connection is accomplished.

* * * * *